(12) United States Patent
Liou et al.

(10) Patent No.: US 8,030,098 B1
(45) Date of Patent: Oct. 4, 2011

(54) PRE-FORMED CONDUCTIVE BUMPS ON BONDING PADS

(75) Inventors: Shiann-Ming Liou, Campbell, CA (US);
Albert Wu, Palo Alto, CA (US);
Huahung Kao, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 137 days.

(21) Appl. No.: 12/198,659

(22) Filed: Aug. 26, 2008

Related U.S. Application Data

(60) Provisional application No. 60/968,743, filed on Aug. 29, 2007.

(51) Int. Cl.
*H01L 21/66* (2006.01)
*G01R 31/26* (2006.01)

(52) U.S. Cl. .......... 438/15; 438/617; 257/E23.021

(58) Field of Classification Search .......... 438/617, 438/15; 257/E23.021
See application file for complete search history.

(56) References Cited

U.S. PATENT DOCUMENTS

| | | | |
|---|---|---|---|
| 7,160,797 B2 * | 1/2007 | Beatson | 438/617 |
| 2002/0109216 A1 * | 8/2002 | Matsuzaki et al. | 257/686 |
| 2003/0143797 A1 * | 7/2003 | Paik et al. | 438/200 |

* cited by examiner

*Primary Examiner* — Jenny L Wagner

(57) ABSTRACT

Apparatuses including pre-forming conductive bumps on bonding pads for probing and wire-bonding connections and methods for making the same are disclosed. A method may include providing a microelectronic die including a conductive bump formed on a bonding pad, and an insulating layer formed on at least a portion of a surface of the conductive bump, and probing the conductive bump to test the microelectronic die. Other embodiments are also described.

16 Claims, 4 Drawing Sheets

PRE-FORMED CONDUCTIVE BUMPS ON BONDING PADS

CROSS-REFERENCE TO RELATED APPLICATIONS

The present application claims priority to U.S. Provisional Patent Application No. 60/968,743, entitled "Preformed Balls on Bonding Pads for Probing and Wire-Bonding Connections," filed Aug. 29, 2007, the entire disclosure of which is hereby incorporated by reference in its entirety for all purposes, except for those sections, if any, that are inconsistent with this specification.

TECHNICAL FIELD

Embodiments of the present invention relate to the field of microelectronic device packaging and, more particularly, to pre-forming conductive bumps on bonding pads for probing and wire-bonding connections.

BACKGROUND

Microelectronic dies are often tested for functionality and/or reliability prior to packaging. This testing is typically carried out by probing a bonding pad of a die, and then supplying and/or detecting signals and/or power from the bonding pad. This testing may serve any number of purposes including, for example, ensuring faulty products are not shipped to consumers as well as gauging the manufacturing process.

Although testing is generally beneficial, the probe used to test the die is sometimes known to leave marks or gouges on the bonding pad. Unfortunately, these marks may affect the quality of the bond between the bonding pad and the interconnecting wire.

SUMMARY

In view of the problems in the state of the art, embodiments of the present invention are directed to forming conductive bumps on bonding pads for probing and/or for wire-bonding connections. More specifically, there is provided, in accordance with various embodiments of the present invention, a method comprising providing a microelectronic die including a conductive bump formed on a bonding pad, and an insulating layer formed on at least a portion of a surface of the conductive bump. The method may further comprise probing the conductive bump to test the microelectronic die.

In various embodiments, the providing of the microelectronic die may comprise forming the conductive bump on the bonding pad, and forming the insulating layer on the microelectronic die. In some embodiments, the conductive bump may be formed on the bonding pad by a wire-bonding operation.

In various embodiments, the bonding pad may comprise an un-probed bonding pad.

In various embodiments, the method may further comprise wire-bonding the probed conductive bump with a conductive structure. In some embodiments, the bonding pad may comprise a first bonding pad and the conductive structure may comprise a second bonding pad. In some embodiments, the microelectronic die may comprise a first microelectronic die and the second bonding pad may be disposed on the first microelectronic die. In some embodiments, the second bonding pad may be disposed on a second microelectronic die.

In some embodiments, the conductive structure may be disposed on a leadframe or a carrier substrate.

In some embodiments, the conductive bump may comprise a first conductive bump and the conductive structure may comprise a second conductive bump. In some embodiments, the second conductive bump may be disposed on the microelectronic die. In some embodiments, the microelectronic die may comprise a first microelectronic die and the second conductive bump may be disposed on a second microelectronic die.

In various embodiments, the method may further comprise planarizing the insulating layer and the conductive bump.

In various embodiments, the conductive bump may comprise a material selected from a group comprising gold, copper, silver, and tin-lead alloy. In various embodiments, the insulating layer may comprise a material selected from a group comprising epoxy, silicone, and polyamide.

An apparatus is also described. The apparatus may comprise a microelectronic die including a conductive bump formed on an un-probed bonding pad, and an insulating layer formed on at least a portion of a surface of the conductive bump, and a carrier structure wire-bonded with the conductive bump.

In various embodiments, the carrier structure may include a conductive pad, and the conductive bump may be wire-bonded with the conductive pad of the carrier structure.

In various embodiments, the carrier structure may comprise a leadframe or a carrier substrate.

In various embodiments, a top surface of the insulating layer may be substantially co-planar with a top surface of the conductive bump.

In various embodiments, the conductive bump may comprise a material selected from a group comprising gold, copper, silver, and tin-lead alloy. In various embodiments, the insulating layer may comprise a material selected from a group comprising epoxy, silicone, and polyamide.

Another apparatus is also described. The apparatus may comprise a first microelectronic die including a conductive bump formed on a first un-probed bonding pad, and an insulating layer formed on at least a portion of a surface of the conductive bump, and a second microelectronic die including a second bonding pad wire-bonded with the conductive bump.

In various embodiments, the conductive bump may comprise a first conductive bump, and the second microelectronic die may include a second conductive bump formed on the second bonding pad, the first conductive bump being wire-bonded with the second conductive bump.

In various embodiments, the apparatus may further comprise a carrier structure, the first and second microelectronic dies being mounted on the carrier structure.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The terms "coupled to," along with its derivatives, may be used herein. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

The terms chip, die, integrated circuit, monolithic device, semiconductor device, and microelectronic device are often used interchangeably in the microelectronics field. The present invention is applicable to all of the above as they are generally understood in the field.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element.

Various embodiments of the present invention are directed to apparatuses including pre-formed conductive balls on bonding pads for probing and/or for wire-bonding connections, and methods for forming and using the same.

Figure 1:
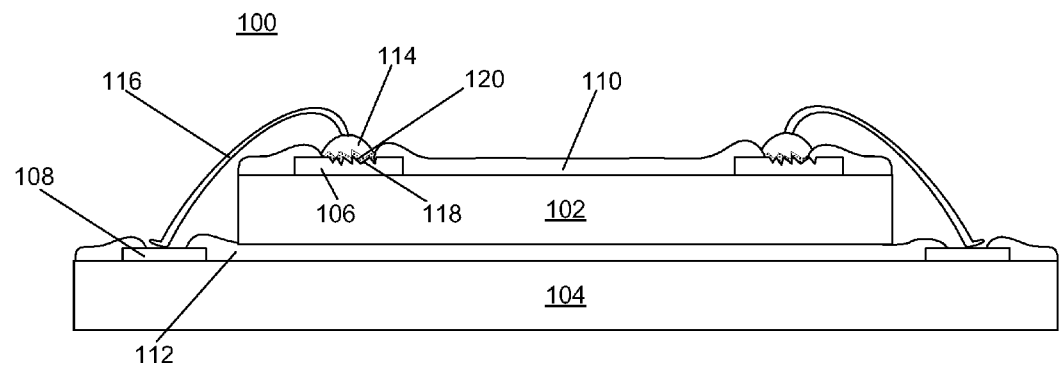
FIG. 1 illustrates a cross-sectional side view of a related art microelectronic apparatus.

Various embodiments of the present invention may be more easily understood in the context of related art. A cross-sectional side view of a related art microelectronic apparatus 100 is illustrated in FIG. 1. As illustrated, apparatus 100 includes a first microelectronic die 102 mounted onto another structure such as a second microelectronic die 104. The first die 102 and the second die 104 each include bonding pads 106, 108, respectively, and a passivation layer 110, 112, respectively.

As illustrated, bonding pads 106 are wire-bonded to bonding pads 108. For this bonding, a conductive ball is formed on an end of a wire 116 and then bonded to bonding pad 106 to form a conductive bump 114. The other end of wire 116 is then bonded to bonding pad 108. In the illustrated depiction, conductive bump 114 is ball-bonded to bonding pad 106 and the other end of wire 116, which is still connected to conductive bump 114, is wedge-bonded to bonding pad 108. The conductive ball used for forming conductive bump 114 may be formed during the wire-bonding operation by melting an end of wire 116.

Oftentimes, dies are tested after they are formed to ensure they have the desired functionality and/or reliability. This is typically done by probing various bonding pads with a probe and then providing to the die and/or detecting from the die, signals and/or power. Some types of dies, such as memory dies, for example, may be probed multiple times. In the related art, the probing of the bonding pads is typically performed prior to formation of conductive bump 114.

Although probing the bonding pads may ensure functionality and/or reliability of a final product, the probing of the bonding pads may leave marks 118 (gouges) on the bonding pads. Marks 118 may result in the bonding between conductive bump 114 and bonding pad 106 being less than optimal. As is typically the case, bonding pad 106 may be formed from one material, while conductive bump 114 may be formed from another material. So, when conductive bump 114 is bonded to bonding pad 106, an intermetallic compound layer 120 may be formed at their interface. Intermetallic compound 120 may result in a weak bond between conductive bump 114 and bonding pad 106 due at least in part to its non-uniformity resulting from marks 118 in bonding pad 106.

In various embodiments of the present invention, a conductive bump may be formed on a bonding pad prior to probing and/or for wire-bonding connections. Forming the conductive bump prior to probing may result in a stronger bond between the conductive ball and the bonding pad relative to related art apparatuses such as, for example, apparatus 100 illustrated in FIG. 1. This increased bonding strength may be due at least in part to the conductive bump being bonded to a substantially pristine bonding pad so that an intermetallic compound layer formed at their interface is substantially uniform.

FIGS. 2-12 illustrate cross-sectional views of a microelectronic apparatus at various stages of a method for forming the same in accordance with various embodiments of the present invention.

Figure 2:
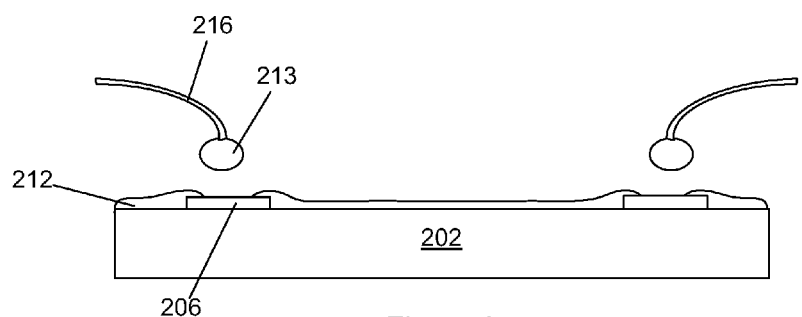
FIGS. 2-12 illustrate cross-sectional views of a microelectronic apparatus at various stages of a method for forming the same in accordance with various embodiments of the present invention.
Figure 3:
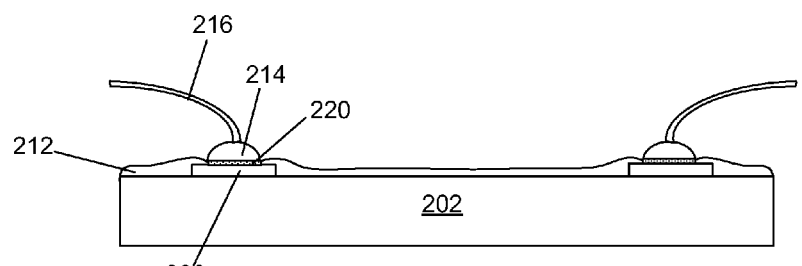

As illustrated in FIG. 2, a first microelectronic die 202 includes at least one bonding pad 206 and a passivation layer 212 formed over first die 202 with at least a portion of a top surface of bonding pad 206 exposed. A conductive ball 213 formed on an end of a wire 216 is bonded to bonding pad 206 by a ball-bonding operation as illustrated in FIG. 3 to form a conductive bump 214. Conductive ball 213 may be formed by melting the end of wire 216 by any method suitable for the purpose including, for example, electrostatic discharge.

Wire 216 (and thus conductive bump 214) and bonding pad 206 may each comprise any material suitable for the purpose. For example, wire 216 may comprise gold. In various other embodiments, wire 216 may comprise copper, silver, or tin-lead alloy. Other materials may be similarly suitable. In various embodiments, bonding pad 206 may comprise aluminum, copper, or another suitable material.

As illustrated, bonding pad 206 is substantially pristine. At this point, no probing (or minimal probing) of bonding pad 206 has been performed and so the top surface of bonding pad 206 has few, or even no, marks or gouges thereon (in contrast to marks 118 on bonding pad 106 illustrated in FIG. 1). Accordingly, when conductive ball 213 is bonded to bonding pad 206, and when conductive ball 213 and bonding pad 206 comprise different materials, a substantially uniform intermetallic compound layer 220 is formed at their interface. In various embodiments, the uniform intermetallic compound layer 220 may result in a stronger bond between conductive bump 214 and bonding pad 206 relative to a bond that may be formed between a bonding pad that has been probed prior to bonding a conductive ball thereto.

Figure 4:
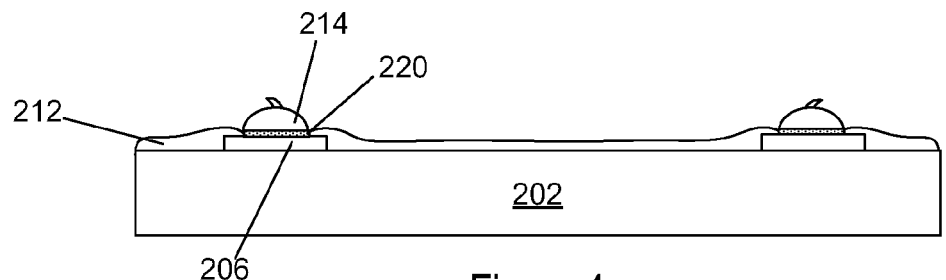

After conductive ball 213 is bonded to bonding pad 206, wire 216 may be cut, leaving conductive bump 214 as illustrated in FIG. 4.

Figure 5:
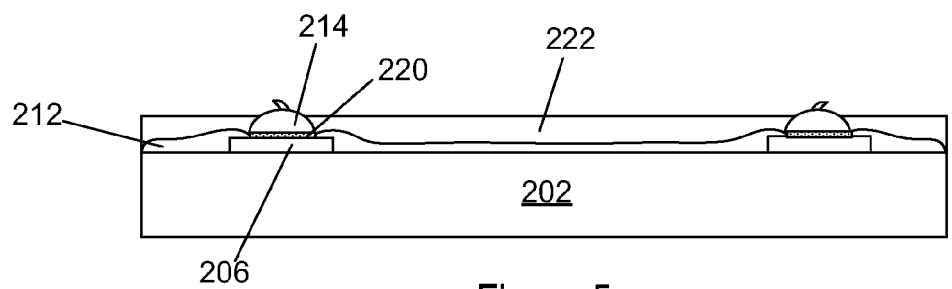

An insulating layer 222 may be formed on first die 202 as illustrated in FIG. 5. As illustrated, insulating layer 222 is formed on at least a portion of conductive bump 214. Insulating layer 222 may, in some embodiments, provide a protective function. In various embodiments, insulating layer 222 may be suitable for encapsulating first die 202 so that first die 202 constitutes a chip-scale package. In various other embodiments, insulating layer 222 may be used for providing structural support to conductive bump 214 to resist dislodging of conductive bump 214.

Insulating layer 222 may comprise any material suitable for the desired purpose. For example, insulating layer 222 may comprise epoxy, silicone, or polyamide. Those skilled in the art will understand that other materials may be similarly suitable.

Figure 6:
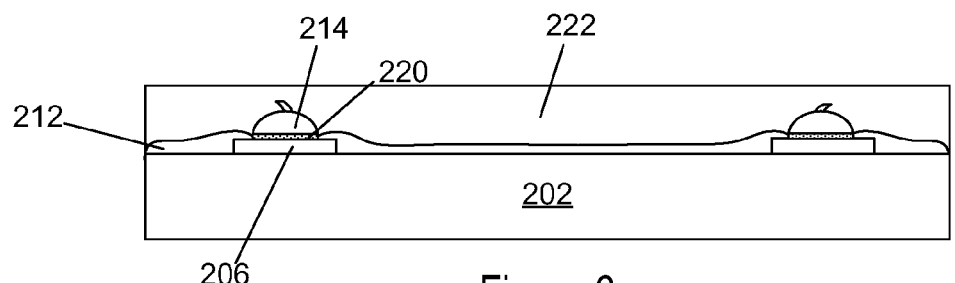
Figure 7:
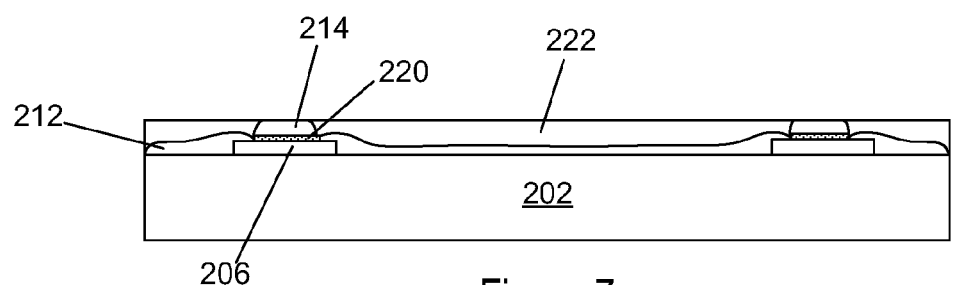

As illustrated in FIG. 5, insulating layer 222 has a thickness that is less than the height of conductive bump 214 (i.e., conductive bump 214 protrudes above the surface of insulating layer 222). Rather than controlling the thickness of insulating layer 222 so that it allows conductive bump 214 to be exposed, insulating layer 222 may instead be a continuous layer formed to cover conductive bump 214 as illustrated in FIG. 6. In these embodiments, insulating layer 222 may then be planarized or polished to remove enough of insulating layer 222 to expose conductive bump 214 as illustrated in FIG. 7. In some embodiments, the planarization operation may remove a portion of conductive bump 214 so that the top surface of insulating layer 222 and the top surface of conductive bump 214 are substantially co-planar as illustrated.

Figure 8:
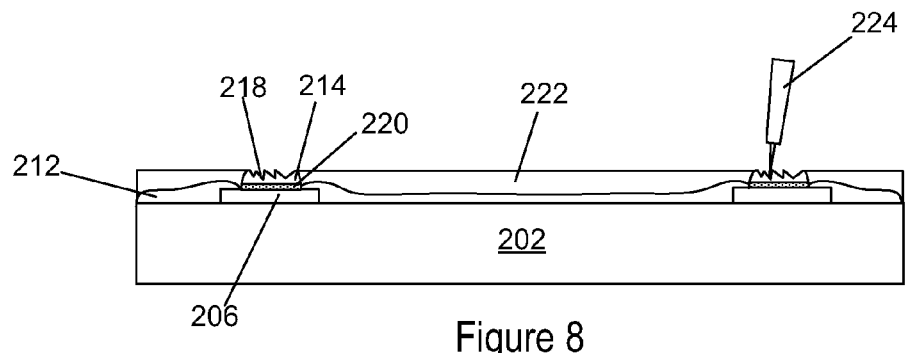

As illustrated in FIG. 8, the exposed conductive bump 214 may then be probed for various purposes including, for example, testing a functionality and/or reliability of first die 202. In these embodiments, probe 224 may be used to contact conductive bump 214 for providing to first die 202 and/or detecting from first die 202 signals and/or power. As described more fully herein, probe 224 may leave marks 218 on the surface of conductive bump 214.

Figure 9:
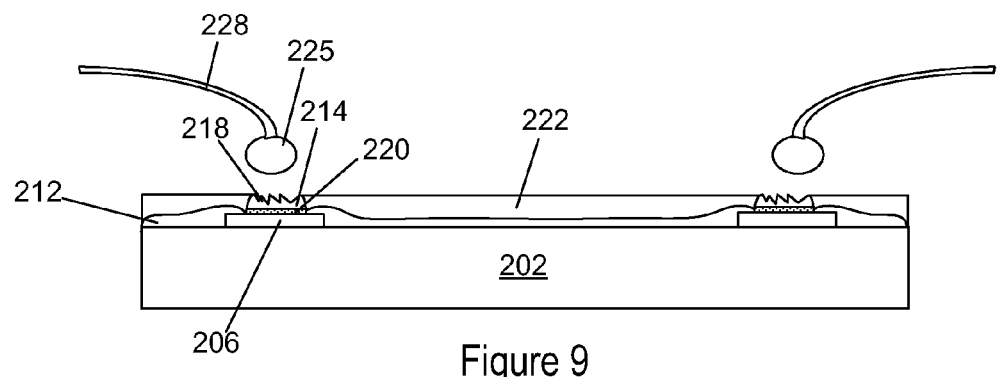
Figure 10:
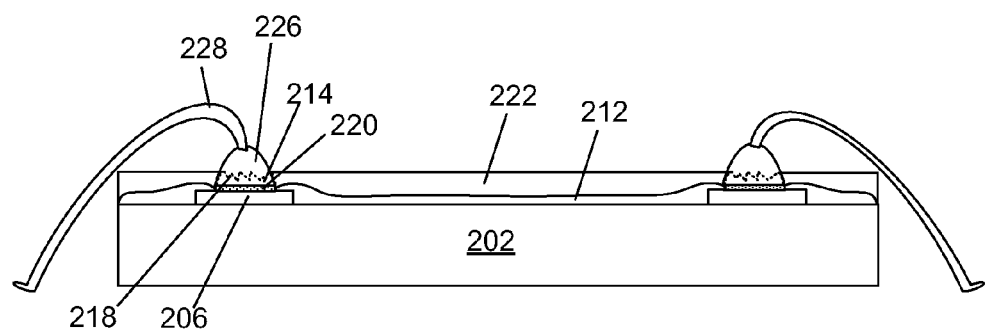
Figure 11:
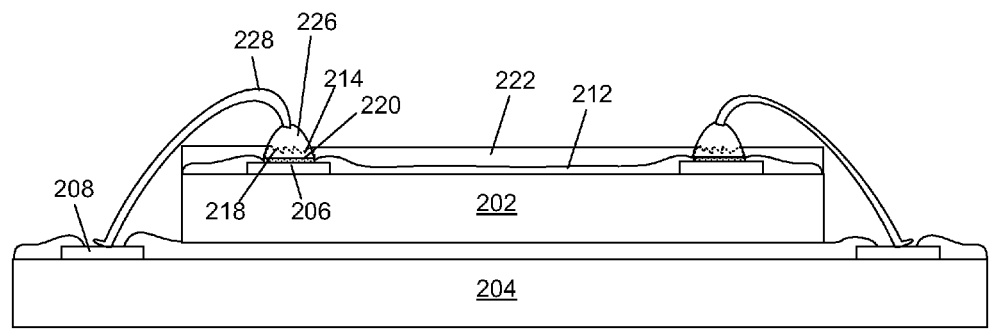
Figure 12:
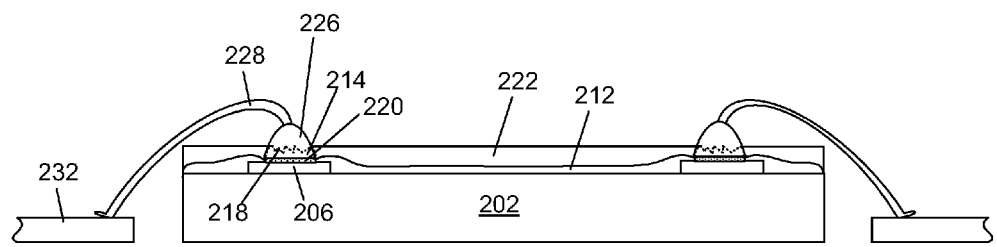

The probed conductive bump 214 may be used for wire-bonding. For this bonding, a conductive ball 225 is formed on an end of a wire 228 as illustrated in FIG. 9. Conductive ball 225 may be bonded to probed conductive bump 214 to form a conductive bump 226 as illustrated in FIG. 10. The other end of wire 228 may then be bonded to another conductive structure. Conductive bump 226 may be wire-bonded to a conductive structure such as, for example, a bonding pad 208 of a second microelectronic die 204 as illustrated in FIG. 11, a leadframe 232 as illustrated in FIG. 12, or some other conductive structure. As illustrated in FIGS. 11 and 12, the other end of wire 228 may be wedge-bonded to bonding pad 208 or leadframe 232, respectively. With regard to FIG. 11, although the illustrated embodiment generally depicts first die 202 as being stacked onto second die 204 to form a multi-chip structure, in various other embodiments, first die 202 and second die 204 may be oriented in a different manner (in a side by side orientation, for example).

As noted previously, marks 218 remain on the surface of conductive bump 214 after probing (see FIG. 8). In contrast to the detrimental effect of marks 118 left on bonding pad 106 of apparatus 100 as illustrated in FIG. 1, marks 218 may have minimal, if any, effect on the bond strength resulting between conductive bump 214 and conductive bump 226. This improved bond strength may be due at least in part to conductive bump 214 and conductive bump 226 being comprised of the same material. For example, if conductive bump 214 comprises gold, conductive bump 226 may be formed from gold as well so that when conductive bump 214 and conductive bump 226 are bonded, no intermetallic compound layer is formed since their materials are the same.

Figure 13:
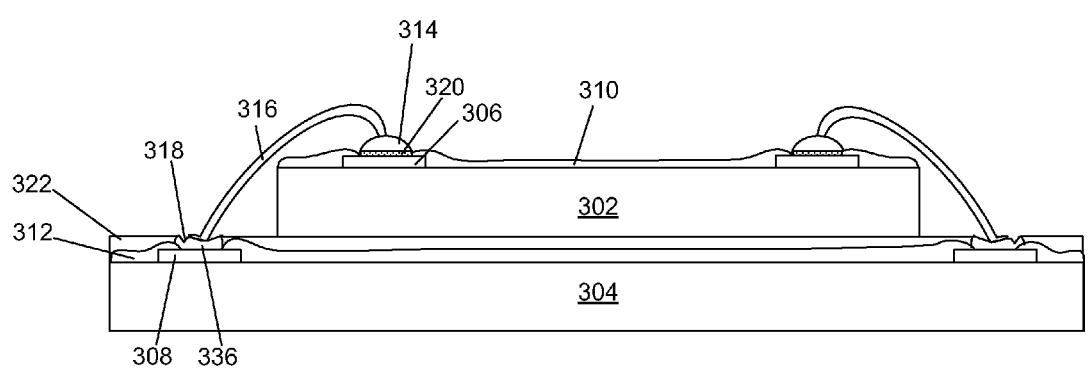
FIG. 13 illustrates a cross-sectional view of a microelectronic apparatus in accordance with various embodiments of the present invention.

In some embodiments, rather than wire-bonding a conductive ball to a pre-formed conductive bump (such as, for example, conductive bump 214), the pre-formed conductive bump may be used for wedge-bonding thereto as illustrated in FIG. 13.

As illustrated, a first die 302 is mounted onto a second die 304. First die 302 and second die 304 each include bonding pads 306, 308, respectively, and a passivation layer 310, 312, respectively. Second die 304 includes a conductive bump 336 and an insulating layer 322 formed on at least a portion of conductive bump 336.

Bonding pad 306 and conductive bump 336 are wire-bonded to each other by wire 316. Wire 316 may be used forming conductive bump 314 on one end thereof, while the other end of wire 316 may be bonded to conductive bump 336. Bonding pad 306 may be probed to test first die 302, or may instead be un-probed as illustrated so that a substantially uniform intermetallic compound layer 320 is formed at the interface of conductive bump 314 and bonding pad 306. As described herein, bonding a conductive bump to a probed bonding pad may result in a bond that is less than desirable in terms of strength of the bond. Accordingly, in some embodiments, a pre-formed conductive bump may be formed on bonding pad 306 prior to probing, if performed, so that a stronger bond between bonding pad 306 and conductive bump 314 results (as described more fully herein with respect to FIGS. 2-12).

As illustrated, conductive bump 336 includes probe marks 318. In contrast to FIGS. 11 and 12 in which a conductive bump is formed on top of a probed conductive bump for wire-bonding, in the embodiment illustrated in FIG. 13, an end of wire 316 is wedge-bonded to probed conductive bump 336. Although conductive bump 336 includes probe marks 318, wire 316 and conductive bump 336 are formed from the same material and so marks 318 may have minimal, if any, effect on their bond strength.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method for testing functionality of a microelectronic die, the method comprising:
   providing the microelectronic die, the microelectronic die having a bonding pad;
   forming a conductive bump on the bonding pad;
   forming an insulating layer on the microelectronic die such that a top surface of the insulating layer is substantially co-planar with a top surface of the conductive bump;
   subsequent to forming the insulating layer on the microelectronic die, probing the conductive bump to test the functionality of the microelectronic die; and
   planarizing each of the insulating layer and the conductive bump to remove material from each of the insulating layer and the conductive bump, the planarizing being performed (i) prior to probing the conductive bump and (ii) to provide the insulating layer having the top surface such that the top surface of the insulating layer is substantially co-planar with the top surface of the conductive bump.

2. The method of claim 1, wherein forming the conductive bump on the bonding pad comprises using a wire-bonding operation to form the conductive bump on the bonding pad.

3. The method of claim 1, wherein the bonding pad is un-probed, prior to forming the insulating layer on the microelectronic die.

4. The method of claim 1, further comprising, subsequent to probing the conductive bump, wire-bonding the conductive bump to a conductive structure.

5. The method of claim 4, wherein the conductive bump is wire-bonded to the conductive structure by ball-bonding a conductive ball formed on an end of a wire to the probed conductive bump.

6. The method of claim 4, wherein the conductive bump is wire-bonded to the conductive structure by wedge-bonding a wedge formed on an end of a wire to the probed conductive bump.

7. The method of claim 4, wherein the bonding pad comprises a first bonding pad and wherein the conductive structure comprises a second bonding pad.

8. The method of claim 7, wherein the second bonding pad is disposed on the microelectronic die.

9. The method of claim 7, wherein the microelectronic die comprises a first microelectronic die and wherein the second bonding pad is disposed on a second microelectronic die.

10. The method of claim 4, wherein the conductive structure is disposed on a leadframe or a carrier substrate.

11. The method of claim 4, wherein the conductive bump comprises a first conductive bump and wherein the conductive structure comprises a second conductive bump.

12. The method of claim 11, wherein the second conductive bump is disposed on the microelectronic die.

13. The method of claim 11, wherein the microelectronic die comprises a first microelectronic die and wherein the second conductive bump is disposed on a second microelectronic die.

14. The method of claim 1, wherein the conductive bump comprises at least one of gold, copper, silver, or tin-lead alloy.

15. The method of claim 1, wherein the insulating layer comprises at least one of epoxy, silicone, or polyamide.

16. The method of claim 1, further comprising
   depositing the insulating layer to cover the conductive bump prior to planarizing each of the insulating layer and the conductive bump.

* * * * *